(12) United States Patent
Bowman et al.

(10) Patent No.: US 10,024,916 B2
(45) Date of Patent: *Jul. 17, 2018

(54) SEQUENTIAL CIRCUIT WITH ERROR DETECTION

(71) Applicant: INTEL CORPORATION, Santa Clara, CA (US)

(72) Inventors: Keith A. Bowman, Hillsboro, OR (US); James W. Tschanz, Portland, OR (US); Nam Sung Kim, Hillsboro, OR (US); Janice C. Lee, Beaverton, OR (US); Christopher B. Wilkerson, Portland, OR (US); Shih-Lien L. Lu, Portland, OR (US); Tanay Karnik, Portland, OR (US); Vivek K. De, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/422,392

(22) Filed: Feb. 1, 2017

(65) Prior Publication Data

US 2017/0139006 A1  May 18, 2017

Related U.S. Application Data

(63) Continuation of application No. 14/878,985, filed on Oct. 8, 2015, now Pat. No. 9,594,625, which is a continuation of application No. 13/664,153, filed on Oct. 30, 2012, now Pat. No. 9,189,014, which is a continuation of application No. 12/286,067, filed on Sep. 26, 2008, now Pat. No. 8,301,970.

(51) Int. Cl.
*G01R 31/3177* (2006.01)
*G01R 31/317* (2006.01)

(52) U.S. Cl.
CPC ... *G01R 31/3177* (2013.01); *G01R 31/31723* (2013.01); *G01R 31/31725* (2013.01)

(58) Field of Classification Search
CPC .......... G01R 31/3177; G01R 31/31723; G01R 31/31725; G01R 31/31727; G06F 1/10; G06F 11/0706; G06F 11/0757; G06F 11/0793; H03K 3/0375
See application file for complete search history.

(56) References Cited

U.S. PATENT DOCUMENTS

| | | | |
|---|---|---|---|
| 3,597,693 A | 8/1971 | McNeilly | |
| 5,132,990 A * | 7/1992 | Dukes | H04L 7/02 327/42 |
| 5,923,676 A * | 7/1999 | Sunter | G01R 31/31858 714/733 |
| 5,960,468 A * | 9/1999 | Paluch | G06F 13/1673 710/57 |
| 6,150,863 A | 11/2000 | Conn et al. | |

(Continued)

*Primary Examiner* — Kyle Vallecillo
(74) *Attorney, Agent, or Firm* — Womble Bond Dickinson (US) LLP

(57) ABSTRACT

Sequential circuits with error-detection are provided. They may, for example, be used to replace traditional master-slave flip-flops, e.g., in critical path circuits to detect and initiate correction of late transitions at the input of the sequential. In some embodiments, such sequentials may comprise a transition detector with a time borrowing latch.

20 Claims, 3 Drawing Sheets

(56) References Cited

U.S. PATENT DOCUMENTS

| | | | |
|---|---|---|---|
| 7,027,542 B1* | 4/2006 | Shihadeh | H04L 7/033 375/354 |
| 7,392,432 B2 | 6/2008 | Needham et al. | |
| 7,480,838 B1* | 1/2009 | Wilkerson | G06F 11/0724 714/700 |
| 7,653,795 B2* | 1/2010 | Bull | G06F 9/383 369/53.44 |
| 2004/0101079 A1* | 5/2004 | Braceras | H03L 7/00 375/373 |
| 2004/0170081 A1 | 9/2004 | Takahashi et al. | |
| 2005/0025188 A1 | 2/2005 | Numakura et al. | |
| 2005/0246613 A1 | 11/2005 | Blaauw et al. | |
| 2007/0162798 A1 | 7/2007 | Das et al. | |
| 2007/0168848 A1* | 7/2007 | Tschanz | G01R 31/31937 714/798 |
| 2007/0290725 A1 | 12/2007 | Saint-Laurent et al. | |
| 2008/0172193 A1 | 7/2008 | Rhee et al. | |
| 2008/0238476 A1 | 10/2008 | Lewis et al. | |
| 2008/0307277 A1 | 12/2008 | Tchanz et al. | |

* cited by examiner

SEQUENTIAL CIRCUIT WITH ERROR DETECTION

The present application is a continuation application of co-pending U.S. patent application Ser. No. 14/878,985, filed on Oct. 8, 2015 entitled "Sequential Circuit with Error Detection", which is a continuation application of U.S. Pat. No. 13/664,153, filed on Oct. 30, 2012 entitled "Sequential Circuit with Error Detection," issued as U.S. Pat. No. 9,189,014 on Nov. 17, 2015, which is a continuation of U.S. patent application Ser. No. 12/286,067 filed Sep. 26, 2008, entitled "Sequential Circuit with Error Detection," issued as U.S. Pat. No. 8,301,970 on Oct. 30, 2012 and claims a priority benefit thereof.

BACKGROUND

Microprocessor clock frequency (FCLK) is typically based on expected worst-case operating parameters such as supply voltage (VCC) droop and temperature. However, since operating parameters are normally not actually at the worst-case extremes, the operating FCLK may be unnecessarily limited. This is illustrated in FIGS. 1A and 1B.

FIG. 1A shows a conventional path where data is driven through a master-slave flip-flop (MSFF) 102 and logic components 104 to a receiving master-slave flip-flop 106. FIG. 1B is a timing diagram illustrating arrival times of the input data (D) to the receiving flip-flop 106 during worst-case dynamic variations and nominal conditions. Within the presence of worst-case dynamic variations, the input data to the receiving flip-flop must arrive a setup time prior to the rising clock edge to ensure correct functionality. In comparison, the input data for the same path arrives much earlier during nominal conditions. The difference between the input data arrival times for these two cases represents an effective timing guardband for dynamic variations.

FIG. 1C shows a conventional circuit to replace flip-flops 106, e.g., in critical path circuits, to account for dynamic extremes and allow for FCLK to be raised. This circuit mitigates the impact of infrequent dynamic variations and transistor aging on FCLK by employing error-detection circuitry to detect late transitions at the input of the sequential (MSFF in this case). The error detection circuitry includes a latch 112 and an XOR gate 116. In the depicted case, the MSFF is a rising edge triggered flip-flop, so latch 112 is transparent when the clock is High. In operation, the XOR gate 116 compares the flip-flop and latch outputs to produce an error signal (ERROR) if they are different, which occurs when late arriving data fails to get clocked through the flip-flop 114 but is passed through the latch to the XOR gate. The error signal is then propagated to the microarchitecture level to enable error recovery.

Unfortunately, this approach is costly in terms of consumed clock energy since an additional latch in conjunction with the MSFF is employed. In addition, the flip-flop is susceptible to datapath metastability issues, whereby a timing error may be undetected. Since undetected errors can normally not be tolerated, a metastability detector is required, resulting in substantial design overhead in both area and power.

Accordingly, a new approach is desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

In accordance with some embodiments, sequential circuits with error-detection are provided. They may, for example, be used to replace traditional master-slave flip-flops, e.g., in critical path circuits to detect and initiate correction of late transitions at the input of the sequential, which may enable performance and/or power benefits through reduction (if not elimination of) clock frequency guardbands. In some embodiments, such sequentials may comprise a transition detector with a time borrowing latch (TDTB). Such circuits may retain the error-detection features associated with previous designs, and at the same time, allow for lower clock energy consumption, reduced sequential delay, and the elimination of datapath metastability.

Figure 1A:
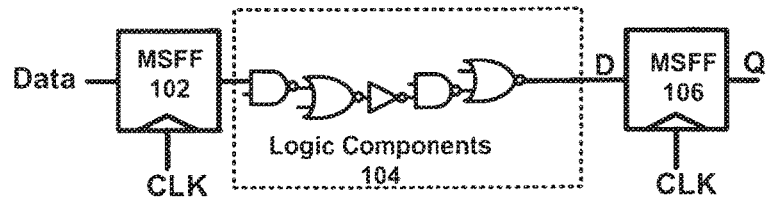
FIG. 1A is a schematic diagram conceptually showing a data path using sequential logic.
Figure 1B:
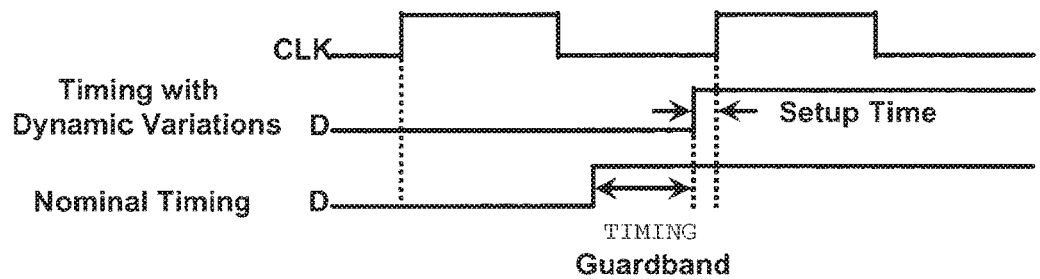
FIG. 1B is a timing diagram for the circuit of FIG. 1A.
Figure 1C:
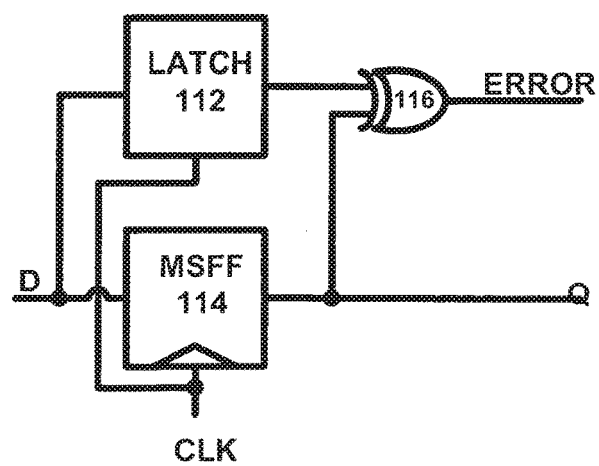
FIG. 1C is a schematic diagram of a previous sequential circuit with error detection.
Figure 2:
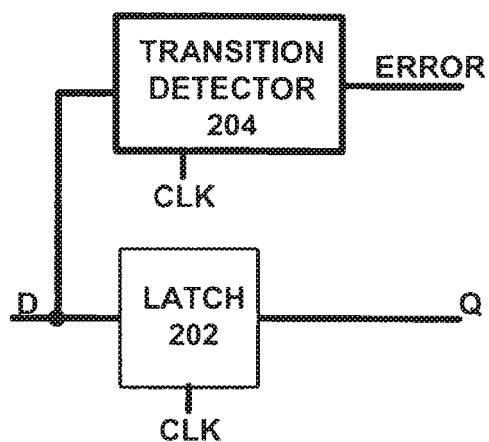
FIG. 2 is a block diagram of a sequential logic element with error detection in accordance with some embodiments.

FIG. 2 is a block diagram of an error detecting sequential in accordance with some embodiments. It generally comprises a latch 202 with an input (D) and an output (Q) and a transition detector 204 coupled to the input of the latch to detect a transition and initiate error correction (e.g., generate error signal to recover data or re-execute instruction) if the transition occurs during the clock phase corresponding to when the latch is transparent. (For simplicity and ease of understanding, it will be assumed that the latches in this description are transparent during High clock phases and opaque during Low clock phases. Accordingly, it is assumed that data is to be transferred through the latch on rising clock transitions. However, it should be appreciated that the same principles apply for other schemes, e.g., Low phase latches and sequentials with data transitioning on falling clock edges.)

In operation, the latch 202 functions to pass along data, e.g., in a critical pipeline path, to the output (Q) after the clock transitions to a High phase. If the data arrives late (during a High phase) the transition detector 204 asserts, which causes the error to be corrected, for example, it may initiate re-execution of an appropriate instruction.

With the use of a latch in the datapath, datapath metastability issues are eliminated. That is, the data (D) will resolve correctly and in time if it arrives just as the clock is transitioning to the High phase. If it arrives too late, it still gets through, albeit possibly not in time to satisfy downstream timing requirements. In this case, however, an error signal will be generated, so any problems caused by the late-arriving data will be averted. With this design, there is an error path metastability issue, because if the data arrives just as the clock is transitioning to a High, the transition detector (depending on its implemented circuitry) may or may not resolve as an error. However, this should not be a problem, though, because if it resolves as an error, the error correction measures are taken. Conversely, if it wrongly fails to resolve as an error (a situation which should only occur during clock transition), the data will still properly be at the output due to the nature of the latch, i.e., it doesn't have metastability issues in the datapath and will pass the data to the output as soon as the clock is High. With this unique characteristic, the error-signal path behaves similar to a traditional synchronizer circuit, resulting in an extremely small probability of a metastable error signal affecting system functionality.

Figure 3:
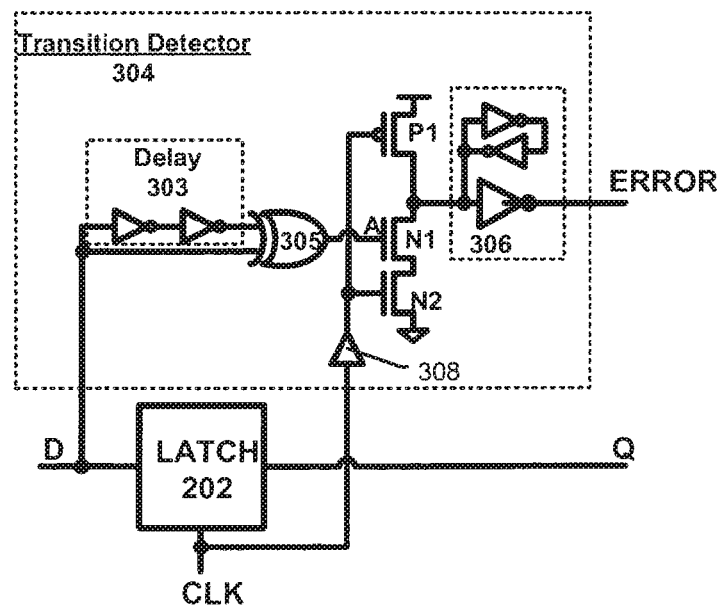
FIG. 3 is a schematic diagram of a sequential logic circuit for the element of FIG. 2 in accordance with some embodiments.

FIG. 3 shows a circuit in accordance with some embodiments for implementing the sequential device of FIG. 2. It has a latch 202 and a transition detector 304. The transition detector 304 comprises delay circuit 303, XOR gate 305, a dynamic inverter formed from NMOS transistors N1, N2 and a PMOS transistor P1, and a keeper circuit 306, all coupled together as shown. Also included is a driver 308 to provide a slight delay for the clock applied to the dynamic inverter. The XOR gate 305 senses input data transitions and in response to a transition, generates a pulse whose width corresponds to the delay of the delay circuit 303. The dynamic inverter functions to discharge if the XOR gate 305 pulses during an evaluate phase, when the clock is High. Its output (at the drain of P1) discharges if this occurs, which causes the hold circuit 306 and thus the driver 308 to output a High (error signal assertion).

During the Low clock phase, the output node voltage of the dynamic gate is pre-charged, causing the ERROR signal to be Low (de-asserted), even if any input data transitions occur. Thus, it prevents the error signal from asserting if data arrives during the Low phase.

Figure 4:
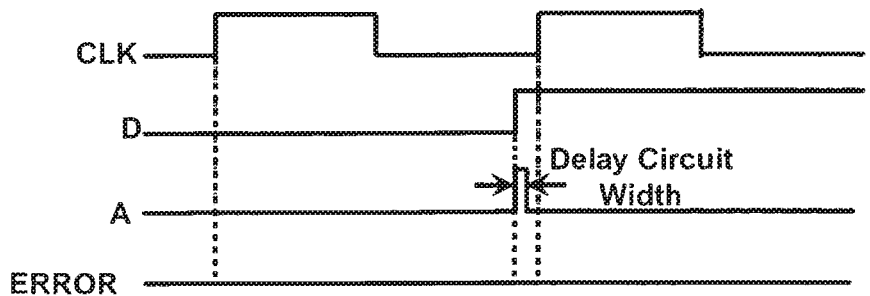
FIGS. 4 and 5 are timing diagrams for the circuit of FIG. 3 in accordance with some embodiments.
Figure 5:
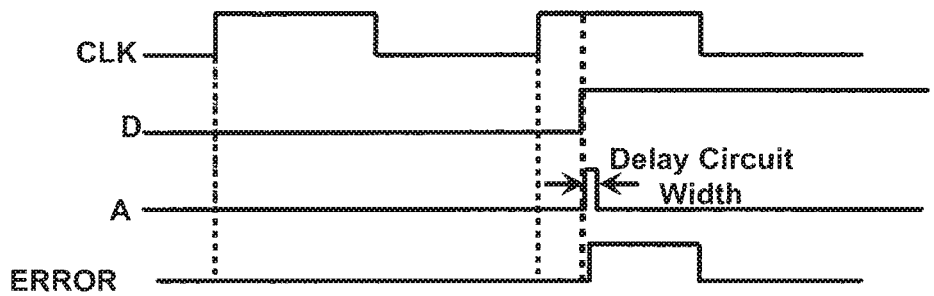

FIGS. 4 and 5 are timing diagrams illustrating operation of the circuit when input data transitions take place during a Low clock (FIG. 4) and during a High clock (FIG. 5). It can be seen that the delay amount for delay circuit 303 should be set, in cooperation with the delay of clock inverter 310 and the sensitivity of the circuit, to be long enough to cause the dynamic inverter to appropriately discharge but short enough so as not to trigger it if the data transition occurs sufficiently soon.

It may be appreciated that since min-delay paths are designed with sufficient margin, latch 202 can be used without the need for a master latch in front of it. So, the datapath latch 202 functions similarly to a pulse-latch, resulting in lower clock energy and eliminating datapath metastability. Although the transition detector portion may become metastable, the metastability issue, as mentioned above, can be managed much easier in the error-signal path as compared to the datapath. As long as the final pipeline-error signal resolves to either a logic-High, resulting in error recovery, or a logic-Low, resulting in no error recovery, correct functionality is maintained. With this unique characteristic, the error-signal path behaves similar to a traditional synchronizer circuit, resulting in an extremely small probability of a metastable error signal affecting system functionality.

Figure 6:
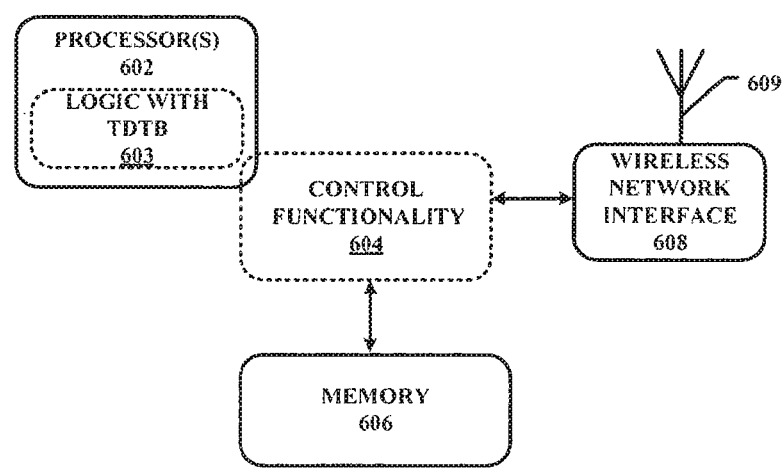
FIG. 6 is a block diagram of a computer system having a microprocessor with at least one sequential logic element with error detection in accordance with some embodiments.

With reference to FIG. 6, one example of a portion of a mobile platform (e.g., computing system such as a mobile personal computer, PDA, cell phone, or the like) is shown. The represented portion comprises one or more processors 602, interface control functionality 604, memory 606, wireless network interface 608, and an antenna 609. The processor(s) 602 is coupled to the memory 606 and wireless network interface 608 through the control functionality 604. The control functionality may comprise one or more circuit blocks to perform various interface control functions (e.g., memory control, graphics control, I/O interface control, and the like. These circuits may be implemented on one or more separate chips and/or may be partially or wholly implemented within the processor(s) 602.

The processor(s) 602 includes one or more logic circuits 603 such as pipeline stages in one or more cores with one or more TDTB error detection sequentials such as those discussed herein. The memory 606 comprises one or more memory blocks to provide additional random access memory to the processor(s) 502, it may be implemented with any suitable memory including but not limited to dynamic random access memory, static random access memory, flash memory, or the like. The wireless network interface 608 is coupled to the antenna 609 to wirelessly couple the processor(s) 602 to a wireless network (not shown) such as a wireless local area network or a cellular network.

The mobile platform may implement a variety of different computing devices or other appliances with computing capability. Such devices include but are not limited to laptop computers, notebook computers, personal digital assistant devices (PDAs), cellular phones, audio and/or or video media players, and the like. It could constitute one or more complete computing systems or alternatively, it could constitute one or more components useful within a computing system.

In the preceding description, numerous specific details have been set forth. However, it is understood that embodiments of the invention may be practiced without these specific details. In other instances, well-known circuits, structures and techniques may have not been shown in detail in order not to obscure an understanding of the description. With this in mind, references to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The term "PMOS transistor" refers to a P-type metal oxide semiconductor field effect transistor. Likewise, "NMOS transistor" refers to an N-type metal oxide semiconductor field effect transistor. It should be appreciated that whenever the terms: "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs, material types, insulator thicknesses, gate(s) configurations, to mention just a few. Moreover, unless specifically referred to as MOS or the like, the term transistor can include other suitable transistor types, e.g., junction-field-effect transistors, bipolar-junction transistors, metal semiconductor FETs, and various types of three dimensional transistors, MOS or otherwise, known today or not yet developed.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

We claim:

1. An error detecting sequential circuit comprising:
   a latch comprising a data output and a data input; and
   a transition detector coupled to the data input to detect a late data transition at the data input, wherein the latch is in a datapath to pass data from the data input to the data output to prevent a datapath metastability when the transition detector fails to detect the late data transition.

2. The error detecting sequential circuit of claim 1, wherein the transition detector comprises a pulse generator coupled to a dynamic logic gate.

3. The error detecting sequential circuit of claim 2, wherein the pulse generator comprises a delay unit and a comparing logic unit.

4. The error detecting sequential circuit of claim 3, wherein the comparing logic unit is an Exclusive-OR (XOR) gate.

5. The error detecting sequential circuit of claim 1, wherein the transition detector is configured to receive a clock signal or a delayed version of the clock signal, and wherein the latch is configured to receive the clock signal.

6. The error detecting sequential circuit of claim 1, wherein the data input is blocked from the data output during a first clock phase and wherein the data input is transparent to the data output during a second clock phase.

7. The error detecting sequential circuit of claim 1, wherein the transition detector is to generate an error signal if the late data transition is detected.

8. The error detecting sequential circuit of claim 1 wherein the latch is in the datapath in a pipeline stage.

9. The chip of claim 1, wherein the latch is a time borrowing latch.

10. A system comprising:
    a memory unit;
    a processor, coupled to the memory unit, the processor comprising
      a pipe-line stage comprising a latch comprising a data output and a data input;
      a transition detector coupled to the data input to detect a late data transition at the data input, wherein the latch is in a data path to pass data from the data input to the data output when the transition detector fails to detect the late data transition to prevent a datapath metastability; and
    a wireless interface for allowing the processor to communicatively coupled to other devices.

11. The system of claim 10, wherein the processor includes one or more processing cores.

12. The system of claim 10, wherein the latch is a time borrowing latch.

13. The system of claim 10, wherein the transition detector is to detect the late data transition at the data input during a clock phase when the latch is transparent.

14. The system of claim 10, wherein the data input is blocked from the data output during a first clock phase and wherein the data input is transparent to the data output during a second clock phase.

15. The system of claim 10, wherein the transition detector comprises a pulse generator coupled to a dynamic logic gate.

16. A chip comprising:
    a time borrowing latch comprising a data output and a data input, the time borrowing latch positioned on a datapath in a pipeline stage; and
    a transition detector coupled to the data input to detect a late data transition at the data input of the time borrowing latch during a clock phase, of a clock signal, when the time borrowing latch is transparent, wherein the time borrowing latch is in the datapath to pass data from the data input to the data output to prevent a datapath metastability when the transition detector fails to detect the late data transition.

17. The chip of claim 16, wherein the transition detector comprises a pulse generator coupled to a dynamic logic gate.

18. The chip of claim 17, wherein the pulse generator comprises a delay unit and a comparing logic unit.

19. The chip of claim 16, wherein the transition detector is configured to receive the clock signal or a delayed version of the clock signal, and wherein the time borrowing latch is configured to receivethe clock signal.

20. The chip of claim 16, wherein the transition detector is to generate an error signal if the late data transition is detected.

* * * * *